United States Patent [19]
Le Tourneur et al.

[11] Patent Number: 5,883,822
[45] Date of Patent: Mar. 16, 1999

[54] DEVICE FOR PROGRAMMABLE DELAY OF AN ANALOG SIGNAL AND CORRESPONDING PROGRAMMABLE ACOUSTIC ANTENNA

[75] Inventors: Grégoire Le Tourneur, Saint-Quay-Perros; Freddy Balestro, Grenoble, both of France

[73] Assignee: France Telecom, Paris, France

[21] Appl. No.: 639,083

[22] Filed: Apr. 24, 1996

[30] Foreign Application Priority Data

Apr. 25, 1995 [FR] France .................................. 95 04918

[51] Int. Cl.[6] ...................................................... G06F 13/00
[52] U.S. Cl. ................................. 364/724.1; 364/715.011
[58] Field of Search ........................... 364/724.1, 715.011

[56] References Cited

U.S. PATENT DOCUMENTS

| | | | |
|---|---|---|---|
| 3,997,772 | 12/1976 | Crochiere et al. | 364/724.1 |
| 4,271,483 | 6/1981 | Baldwin et al. | 364/715.011 |
| 5,157,395 | 10/1992 | Signore et al. | 364/724.1 |
| 5,648,777 | 7/1997 | Bays et al. | 364/724.1 |
| 5,677,858 | 10/1997 | Takeda et al. | 364/724.1 |

FOREIGN PATENT DOCUMENTS

0639347A1  2/1995  European Pat. Off. .

*Primary Examiner*—David H. Malzahn
*Attorney, Agent, or Firm*—Larson & Taylor

[57] ABSTRACT

A device for programmable delay of an analog signal in an acoustic antenna that comprises at least one analog/digital converter circuit delivering, from the analog signal, a digital signal at a first sampling frequency, followed by a delay memory receiving the digital signal in write mode, making it possible to store M consecutive samples in memory. A circuit for write and read access to the delay memory is provided to address the delay memory in write and read mode, which, under read access control, delivers a series of samples delayed by a defined value, a function of the number of samples M stored therein. A sub-sampling circuit receives the delayed digital signal and delivers a sub-sampled delayed digital signal at a second sampling frequency less than the first sampling frequency.

6 Claims, 4 Drawing Sheets

DEVICE FOR PROGRAMMABLE DELAY OF AN ANALOG SIGNAL AND CORRESPONDING PROGRAMMABLE ACOUSTIC ANTENNA

FIELD OF THE INVENTION

The invention relates to a device for programmable delay of an analog signal and to its applications, particularly to programmable acoustic antennae.

BACKGROUND OF THE INVENTION

In present-day sound pick-up systems, acoustic antennae are formed by several microphones, which are configured in such a way as to carry out sound pick-up aiming to cause only slight degradation of the sound signal. To this end, a programmable pure delay signal is introduced into the signal delivered by each microphone, so as either to correct for the physical geometry of the acoustic antenna produced, or to steer the receiving pattern of the acoustic antenna in a given direction with respect to the axis of symmetry of the acoustic antenna. The signals appropriately delayed for each microphone are then summed in order to deliver a resultant signal representative of the sound signal.

A first solution for performing this delay function consists in inserting analog delay lines in cascade with each microphone. This solution, however, exhibits the drawbacks and limitations of analog systems, that is to say inadequate reproducibility and precision for professional applications.

A second solution may consist, however, on the basis of a signal digitized either after each microphone or after summing, this digitized signal consisting of successive samples separated by a sampling period T, in storing these samples in memory. This is because the memory storage of N successive samples has the effect of delaying the transmission of the signal, subjected to this memory storage, by a delay duration of $\Delta = N \times T$. The delay $\Delta$ must however be greater than the duration of the sampling period T, with the desired precision. For sampling frequencies of 16 kHz and 48 kHz, the sampling period is equal to 62.5 $\mu$s and 20.8 $\mu$s respectively.

In certain specific professional applications, the values of sampling period are greater, with a precision of 1 $\mu$s.

In such a case, it is not possible to apply the delay directly to the samples arising from the analog/digital conversion.

It is then necessary to raise the frequency of sampling of the signal delivered by the microphones, by oversampling. For a frequency of the samples, after oversampling, equal to $F_2$, the frequency of the samples before oversampling being equal to $F_1$, the duration of the period of the samples after oversampling is divided in the ratio $K = F_2/F_1$. The value of this ratio is determined by the value of $F_1$, the sampling frequency, and by the precision sought for the delay applied.

For example, for $F_1 = 16$ kHz and for a precision, the minimum delay, $\Delta m = 1$ $\mu$s, the value of K is $K = 63$. The value adopted is the value, the immediately higher multiple of two, $K = 64$.

Such a device is represented diagrammatically in FIG. 1a in which $T_2 = 1/F_2$ is much less than 1 $\mu$s, the delay applied, $\Delta = M \times T_2$, corresponding to the memory storage of M samples. Passing the delayed oversampled signal through a sub-sampling filter, of ratio 1/K, performing the inverse operation, brings the delayed signal back to the sampling frequency $F_1$.

Such a device, described particularly in the document U.S. Pat. No. 3,997,772, makes it possible to introduce a programmed delay of less than the sampling period. However, no integrated component exists capable of performing such a function.

In a general way, as represented in FIG. 1b, it is necessary to use a digital signal processor DSP to implement the oversampling filter, management of the samples in the external memory and the sub-sampling filter. The delay is obtained by writing the samples into the external memory and rereading previously memory-stored samples. The choice of the over- and sub-sampling filters is important. If they are chosen with many coefficients, frequency response is perfect, at the price of high computing power (about 4 MIPS—Mega Instructions Per Second—for $F_1 = 16$ kHz and filters with 256 coefficients), although out-of-band rejection of 70 dB nevertheless causes a slight degradation of the signal.

If, on the other hand, they are chosen to have a lower number of coefficients, 64 coefficients for $F_1 = 16$ kHz, the computing power is certainly reduced to 1 MIPS, but the response curve is greatly degraded, by the presence of undulations in the passband and by poor out-of-band rejection, less than 30 dB, entailing a significant degradation in the signal.

Hence, for a small acoustic antenna including 10 microphones, implementing such delay circuits requires computing power lying between 10 and 40 MIPS. For an acoustic antenna including 64 microphones, an antenna more particularly intended for video conferencing applications, the computing power necessary lies between 64 and 256 MIPS, which requires the use of 2 to 6 DSPs, digital signal processors, to which must be added the external delay memories. The cost of implementing such antennae, even in the case of small antennae, is therefore very high.

In current techniques for analog/digital conversion, a conventional converter usually comprises an anti-aliasing analog filter, in accordance with the Shannon theorem, the signal obtained, limited in frequency, being converted by successive approximation with respect to a reference voltage. The precision of the converter depends on the precision of the comparison with the reference voltage. This type of device requires an analog filter, the cutoff frequency of which is a function of the sampling frequency, which makes it necessary to change the analog filter when changing the sampling frequency. These converters are therefore very inflexible in use.

More recently, another category of analog/digital converters has been developed, these converters including a plurality of conversion stages in cascade each driven by a different sampling frequency.

Such a type of converter is represented in FIG. 1c, and corresponds in a non-limiting way to a converter known as a "delta sigma" converter, denoted $\Delta\Sigma$ converter.

Following first-order low-pass analog filtering, a converter stage quantizes the filtered analog signal at a high rate, $F_1 = 4$ MHz (4096 kHz) for a sampling frequency of $F_3 = 16$ kHz, over a low number of bits, 1, 2 or 3 bits, by virtue of a $\Delta\Sigma$ conversion module shifting the quantization noise to the high frequencies. The converted signal is brought back to an intermediate frequency, for example $F_1 = 16 \times F_2$, i.e. $F_2 = 256$ kHz, by means of a first low-pass filter, over a larger number of bits, then brought back to the format of the sampled signal by passing through a second sub-sampling filter, of low-pass type, over the final number of bits, 16 for example, and at the sampling frequency of $F_3 = 16$ kHz. The advantage of this device resides in the fact that the anti-aliasing filtering function is performed digitally and that the cutoff frequency is adjusted automatically as a function of the final chosen sampling frequency $F_3$.

Such analog/digital conversion devices are very flexible in use, since it suffices to apply the signal, originating from a microphone for example, directly to the input of the analog filter, and to supply the sampling frequency $F_3$, the frequencies $F_2$ and $F_1$ being able to be deduced from it.

SUMMARY OF THE INVENTION

The object of the present invention is to remedy the abovementioned drawbacks of the delay devices of the prior art, particularly those inherent in the use of digital signal processors.

A further object of the present invention is the implementation of a delay device on the basis of an analog/digital converter including a plurality of conversion stages in cascade each driven by a different sampling frequency, which makes it possible to introduce the desired delays into the samples, while dispensing with the use of one or more digital signal processors.

A further subject of the present invention is the implementation, on the basis of such delay devices, of a steerable or compensated acoustic antenna.

The device for programmable delay of an analog signal, the subject of the present invention, is noteworthy in that it comprises at least an analog/digital converter circuit over a reduced number of bits receiving the analog signal and delivering a digital signal, a succession of samples, at a first sampling frequency, a delay memory receiving this digital signal in write mode and allowing memory storage of M consecutive samples. A module for write and read access to this memory is provided, and makes it possible to address this delay memory, in write and read mode, with a write and read frequency equal to the first sampling frequency, the delay memory delivering, under read access control, a series of samples delayed by a defined value, a function of the number M of samples stored in this delay memory, with respect to the succession of samples received for writing at the input of the delay memory, in the form of a delayed digital signal. A sub-sampling module receives the delayed digital signal and delivers a delayed digital signal sub-sampled at a second sampling frequency, lower than the first sampling frequency.

The device for programmable delay of an analog signal which is the subject of the invention finds an application to the production of acoustic antennae intended for consumer or professional applications.

BRIEF DESCRIPTION OF THE DRAWINGS

It will be better understood on reading the description and on perusing the drawings below in which, in addition to FIGS. 1a to 1c which, as described above, relate to a block diagram of a prior art digital sampling—delay arrangement, a block diagram of a prior art implemation of the oversampling filter of FIG. 1a using a digital signal processor, and a block diagram of a prior art delta sigma converter, respectively, FIG. 4a also relating to the prior art.

DESCRIPTION OF THE PREFERRED EMBODIMENTS

A more detailed description of a device for programmable delay of an analog signal in accordance with the subject of the present invention will now be given in connection with FIG. 2 and the following figures.

Figure 1A:
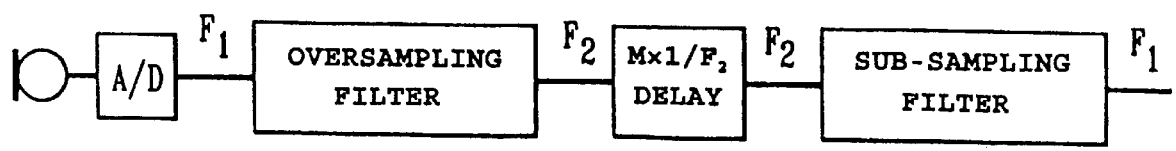
Figure 1B:
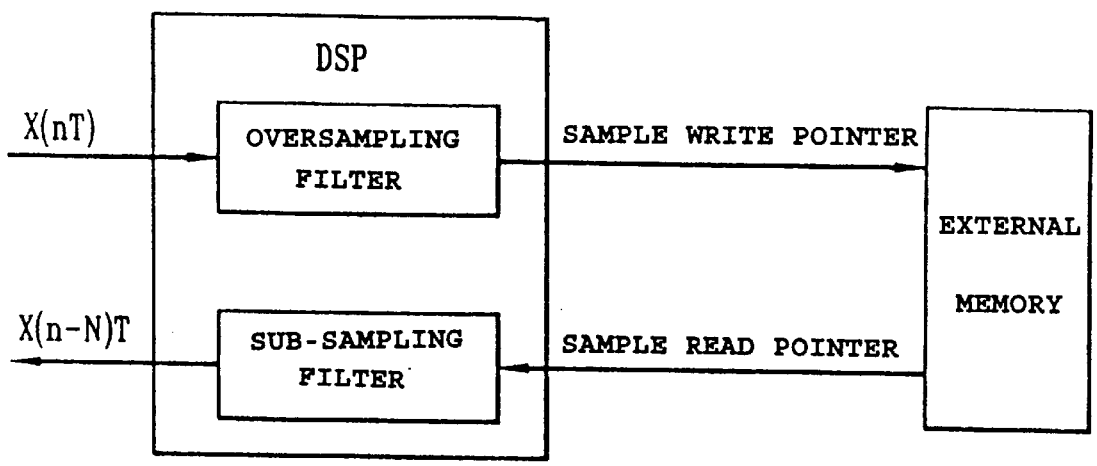
Figure 1C:
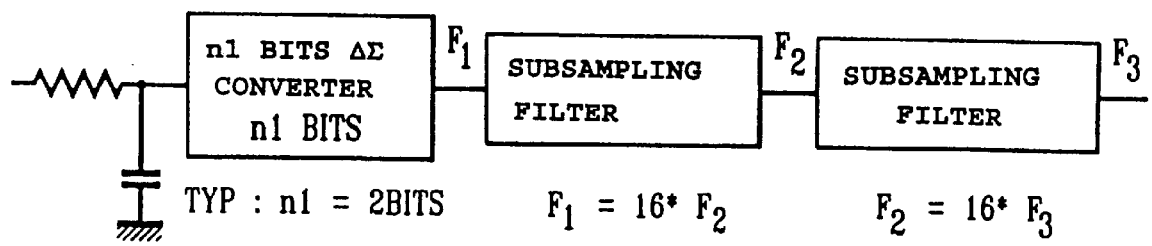
Figure 2:
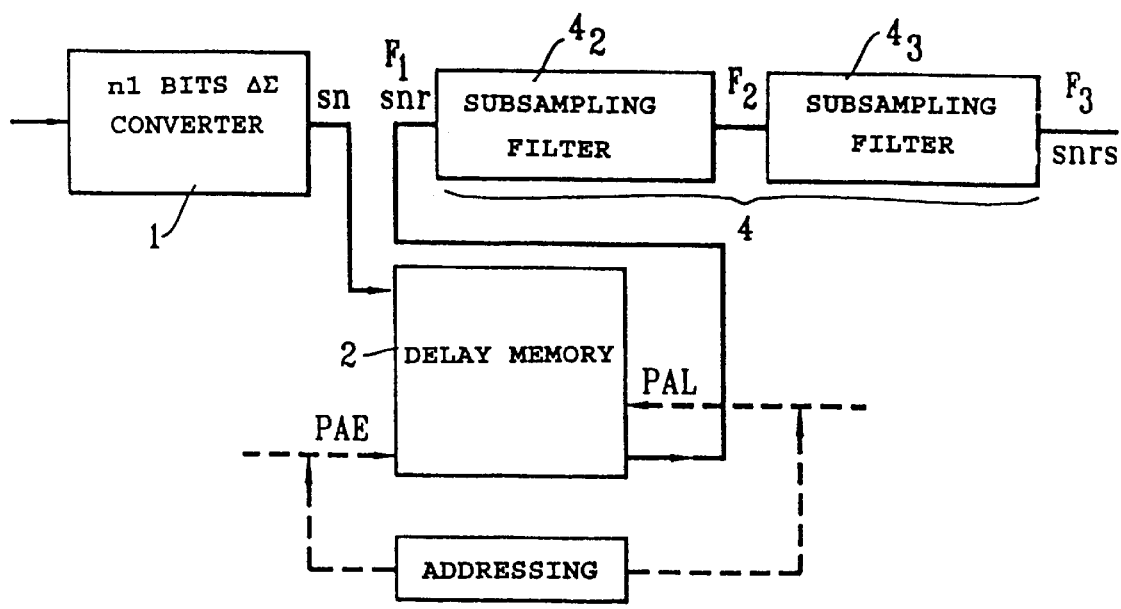
FIG. 2 represents a block diagram of a device for programmable delay of an analog signal, which is the subject of the present invention.

In the abovementioned FIG. 2, the programmable delay device, the subject of the invention, comprises at least one analog/digital converter circuit 1 receiving the analog signal sa constituting the input signal, and delivers a digital signal sn at a first sampling frequency $F_1$, this digital signal consisting of a succession of samples.

In a general way, it is shown that the analog/digital converter circuit 1 performs analog/digital conversion over a lower number of bits, 2 to 3 bits for example, at a very high frequency, above 1 MHz.

The programmable delay device, according to the invention, further includes, in cascade with the analog/digital converter circuit 1, a delay memory 2 receiving the digital signal sn in write mode and allowing memory storage of M consecutive samples.

A module 3 for write and read access to the delay memory 2 is provided, this module 3 making it possible to address the delay memory 2 in write and read mode with a write and read frequency equal to the first sampling frequency $F_1$. The delay memory 2, under read access control by the access module 3 in write and read mode, delivers a series of samples delayed by a defined value, a function of the number of samples stored M in the delay memory 2 with respect to the succession of samples received for writing at the input of this delay memory 2.

The delayed samples delivered by the delay memory 2 constitute a delayed digital signal, denoted snr.

As for the write and read access module 3, it is shown that this may be constructed from an addressing module of a microcontroller, the latter delivering write access and read access pointers respectively, represented by arrows in dashed lines in FIG. 2 and referenced pae and pal respectively. This addressing module will not be described in detail since it corresponds to specifications which are known in the state of the art.

Moreover, the programmable delay device, according to the invention, comprises a sub-sampling circuit 4 receiving the delayed digital signal snr and delivering a delayed digital signal snrs subsampled at a sampling frequency less than the first sampling frequency.

In one specific embodiment of the programmable delay device, the subject of the present invention, it is shown that the analog/digital converter circuit 1 is preferably embodied as a converter including a plurality of conversion stages in cascade each driven by a different sampling frequency. Such converters can be embodied in the form of a $\Delta\Sigma$ converter. More particularly, it is shown that the digital signal sn delivered by this type of converter is that delivered by the first stage of this converter, the signal delivered by this first stage being at a frequency $F_1$ higher than the overall output frequency delivered by the overall ΔΣ converter. It is thus understood that the digital signal sn is delivered at a higher frequency $F_1$, which makes it possible to obtain better precision for the delay applied by the delay memory 2.

From the operating point of view, it is shown that the write and read access circuit 3 simultaneously delivers, to the delay memory 2, the write address pointer pae and at least one read address pointer pal, the difference in the addresses of the abovementioned pointers being equal to the number M of samples stored in memory. The delay introduced by the delay memory is then equal to the product of the number M of samples stored in memory and the period $T_1$, the inverse of the first sampling frequency $F_1$, that is to say the frequency of sampling of the digital signal sn.

In the embodiment of the programmable delay device which is the subject of the present invention as represented in FIG. 2, it is shown that the use of a digital signal processor is no longer necessary to install or implement the over- and sub-sampling functions, which entails an obvious simplification in the production costs.

Moreover, the small number of bits to be stored in memory at the output of the ΔΣ converter also reduces the memory size to be used, typically from 16 bits to 2 bits when the conversion is performed over 2 bits, i.e. an 8-fold reduction in the size of the abovementioned delay memory.

As far as the delay memory 2 is concerned, it is shown that this can be produced as a circular memory of size N, with which a write pointer and at least one read pointer are associated.

For the write operation, at each sampling period, the new incoming value is written into the memory at the location indicated by the write pointer. After this operation, the pointer is incremented by one unit in order to prepare for the writing which will occur at the following sampling period. End-of-address detection is performed for pae=N, and re-initialization of the pointer to the start address is carried out.

As far as the read operation is concerned, a similar mechanism is put in place, the read pointer extracting the value stored in memory at each sampling period. The read pointer pal is incremented by one unit after the read operation in order to prepare the reading during the following sampling period. Re-initialization is performed in a way similar to that of the write pointer. The offset between the write pointer and the read pointer then defines the delay applied by the circular memory. It is noted, however, as will be described below in the description, that several read pointers may be generated simultaneously so as to apply variable delays to the delayed digital signal snr.

Figure 3A:
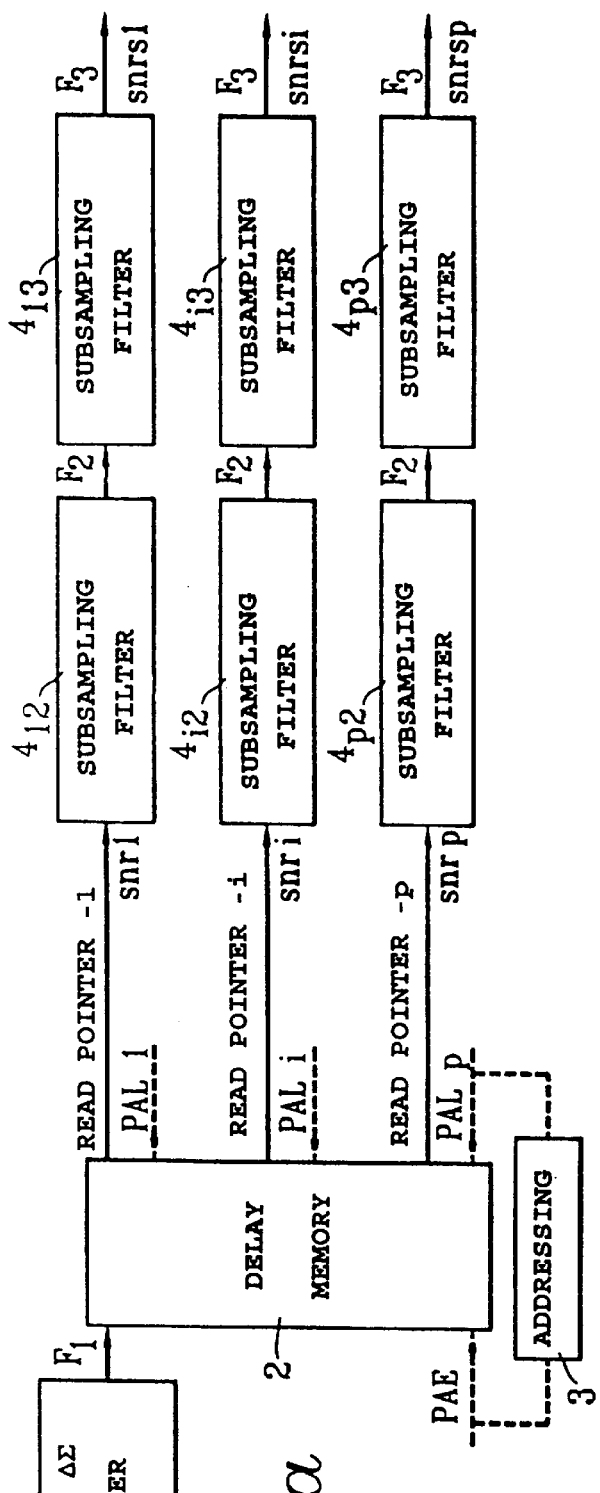
FIG. 3a represents a first embodiment variant of the delay device which is the subject of the present invention implemented for several individually programmable delays.

As represented in FIG. 3a, a first variant embodiment of the programmable delay device, the subject of the invention, makes it possible to obtain several programmable delay values simultaneously by use, at each sampling period, of a write address pointer pae and of a plurality of read address pointers pal on the same delay memory 2. In such a case, the delay memory makes it possible to deliver, over P channels in parallel, P delayed digital signals, the delay of which is proportional to the level i and to the value of the address of the read pointer $pal_i$ of corresponding level with respect to the write pointer.

In such a case, the sub-sampling circuit 4 is then formed by P channels in parallel, each sub-sampling channel receiving a delayed digital signal of corresponding level, denoted $snr_1$, $snr_i$, to $snr_P$.

In a general way, it is shown that the sub-sampling circuit 4 can be formed by a plurality of sub-sampling filters connected in cascade, denoted $4_{ij}$, the index i designating an index related to the delay actually applied, this index i corresponding to the index of the read pointer $pal_i$ of the delay memory 2 while the index j corresponds to an index related to the value of the frequency obtained after sub-sampling by the abovementioned sub-sampling circuit $4_{ij}$. The sub-sampled delayed digital signals delivered by each sub-sampling channel of level i are denoted $snrs_i$. Each level-j sub-sampling filter receives the sub-sampled delayed digital signal delivered by the sub-sampling filter of lower level j−1 at the frequency $F_{j-1}$, the first sub-sampling filter of each sub-sampling channel obviously receiving the signal delivered by the delay memory 2 for the corresponding read address pointer $pal_i$. Each sub-sampling circuit delivers a sub-sampled delayed digital signal at a corresponding sampling frequency $F_j$ successively.

Thus it is shown that each sub-sampling channel comprises a plurality of sub-sampling filters connected in cascade, these, in FIG. 3a, bearing the references $4_{i2}$ and $4_{i3}$ for the channel of corresponding level i, the index j in the annotation $4_{ij}$ equal to 2 and 3 respectively corresponding to the index of the frequency $F_2$, $F_3$ delivered by each sub-sampling filter $4_{i2}$, $4_{i3}$ of each corresponding filter of the sub-sampling channel i.

In the embodiments of the programmable delay device, the subject of the present invention, as described in FIGS. 2 and 3a, it is shown that, in a general way, in order to obtain a delay R and by memory-storage of the samples of the digital signal sn at the frequency $F_1$, the size of the delay memory 2 has to be equal to a value of $M=R/T_1$, where $T_1$ represents the period of sampling of the digital signal sn.

By way of example, it is shown that, for a delay of 5.12 ms and for $F_1$=4096 kHz, the memory size necessary is 20971 words, 16-bit words for example.

A second variant embodiment of the programmable delay device, the subject of the present invention, will now be described in connection with FIG. 3b, in which variant the overall memory size used to produce the delay memory 2 is optimized, that is to say minimized in order to carry out the desired delay function.

Figure 3B:
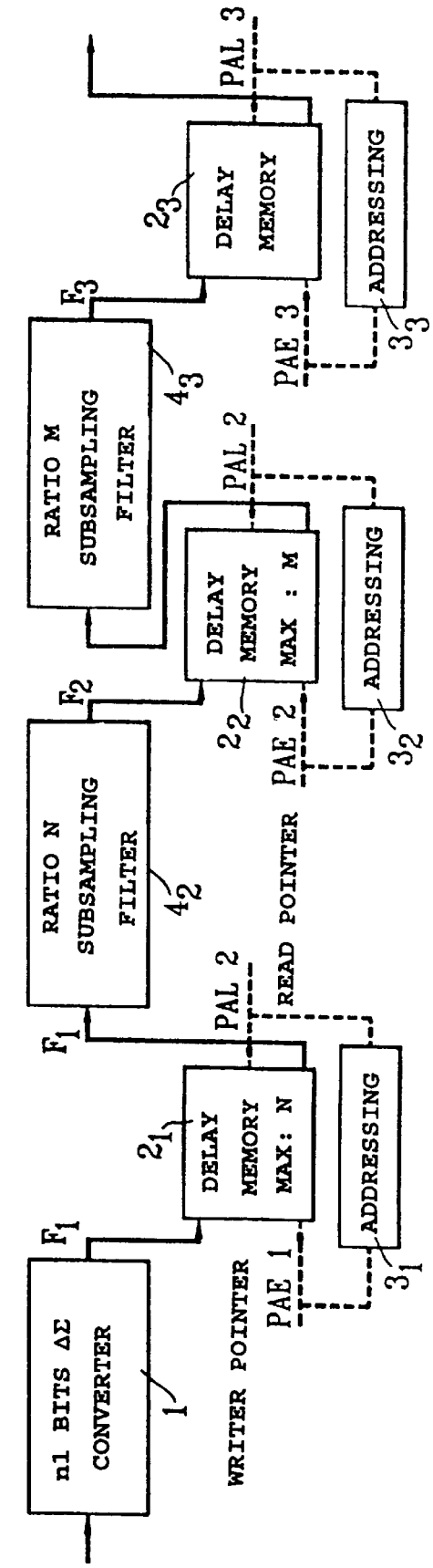
FIG. 3b represents a second embodiment variant of the delay device which is the subject of the present invention, in which the memory size of the delay memory used is minimized.

As represented in the abovementioned FIG. 3b, it is shown that the delay memory 2 is then distributed into a plurality of elementary delay memories. By convention, each elementary memory in FIG. 3b bears the reference $2_{j-1}$, the index j−1, for convenience, corresponding to the index of frequency value of the delayed digital signal delivered by each elementary memory of level j−1 to the sub-sampling circuit of level j, which delivers a sub-sampled signal at the corresponding frequency fj.

Hence, each elementary memory of level j−1 receives an input digital signal at the frequency $F_{j-1}$ and delivers a delayed digital signal $snr_{j-1}$ at the frequency $F_{j-1}$ to the corresponding j-level sub-sampling filter, each elementary memory $2_{j-1}$ being connected to the corresponding sub-sampling circuit $4_j$.

The memory size of each elementary delay memory $2_{j-1}$ of level j−1 is, in accordance with one particularly advantageous characteristic, proportional to the ratio of the frequency $F_{j-1}$ of the digital signal delivered by this elementary delay memory $2_{j-1}$ and the frequency $F_j$ of the sub-sampled delayed digital signal delivered by the level-j sub-sampling filter which is connected to the abovementioned elementary delay memory $2_{j-1}$.

For reasons of convenience, in FIG. 3b, only three elementary delay memories have been represented, bearing the references $2_1$, $2_2$, $2_3$. These are interconnected between the $\Delta\Sigma_1$ converter and the sub-sampling circuit $4_2$, this sub-sampling circuit and the sub-sampling circuit $4_3$, and this latter sub-sampling circuit and the output delivering the sub-sampled delayed digital signal snrs.

Hence, in the embodiment represented in FIG. 3b, the memory size of the elementary delay memory $2_1$, for the digital signal at the frequency $F_1$ is equal to the ratio $F_1/F_2$, i.e. for example, $F_1/F_2=N$. The elementary memory $2_1$ serves to allow introduction of a delay with a value less than the pitch possible at the frequency $F_2$.

In the same way, the memory size of the elementary memory $2_2$, for the digital signal at the frequency $F_2$, is equal to the ratio $F_2/F_3$, i.e. $M=F_2/F_3$. The elementary memory $2_2$ serves in the same way to allow the introduction of a delay of a value less than the pitch possible at the frequency $F_3$.

The memory size of the elementary memory $2_3$ is determined by the maximum value which has been set. For any delay value less than the abovementioned maximum value, there exists a possible breakdown among the three elementary memories $2_1$, $2_2$, $2_3$, which complies with the desired delay value to within the smallest precision.

Hence, for a given delay R, a value of an immediately lower integer k is determined, which is a multiple of the sampling period $T_3$, i.e.

$$k.T_3 \leq R < (k+1).T_3.$$

For a value $R_1$ of the difference between the specified delay R and the delay obtained, that is to say:

$$R_1 = R - k.T_3$$

it is then possible next to determine the possible immediately lower value m, a multiple of the sampling period $T_2$, i.e.:

$$m.T_2 \leq R_1 < (m+1).T_2.$$

For a difference $R_2$ between the abovementioned delay $R_1$ and the delay obtained, satisfying the relation:

$$R_2 = R_1 - m.T_2$$

it is then possible to determine the possible immediately lower value n, a multiple of the sampling period $T_1$, satisfying the relation:

$$n.T_1 \leq R_2 < (n+1).T_1.$$

Having regard to the foregoing developments, the overall delay value is then obtained:

$$\text{delay} = n.T_1 + m.T_2 + k.T_3$$

with n<N, m<M, where $N=T_2/T_1$, $M=T_3/T_2$.

In the embodiment of FIG. 3b, and for delay values corresponding to the embodiment of FIG. 2, i.e. a delay of 5.12 ms and for $F_1=4096$ kHz, $F_2=256$ kHz and $F_3=16$ kHz, k=81, m=14, n=11 are then obtained.

The values of k, m and n represent the memory sizes in terms of number of words of each elementary memory $2_3$, $2_2$ and $2_1$.

Hence, a total of 106 memory words is necessary to perform the specified delay, this total number of memory words having to be compared with the 20971 memory words necessary in the implementation of the device described previously in connection with FIG. 2.

Obviously, it is shown that the number of elementary memories is not limited to three and that it is possible to increase this number if necessary.

Figure 4B:
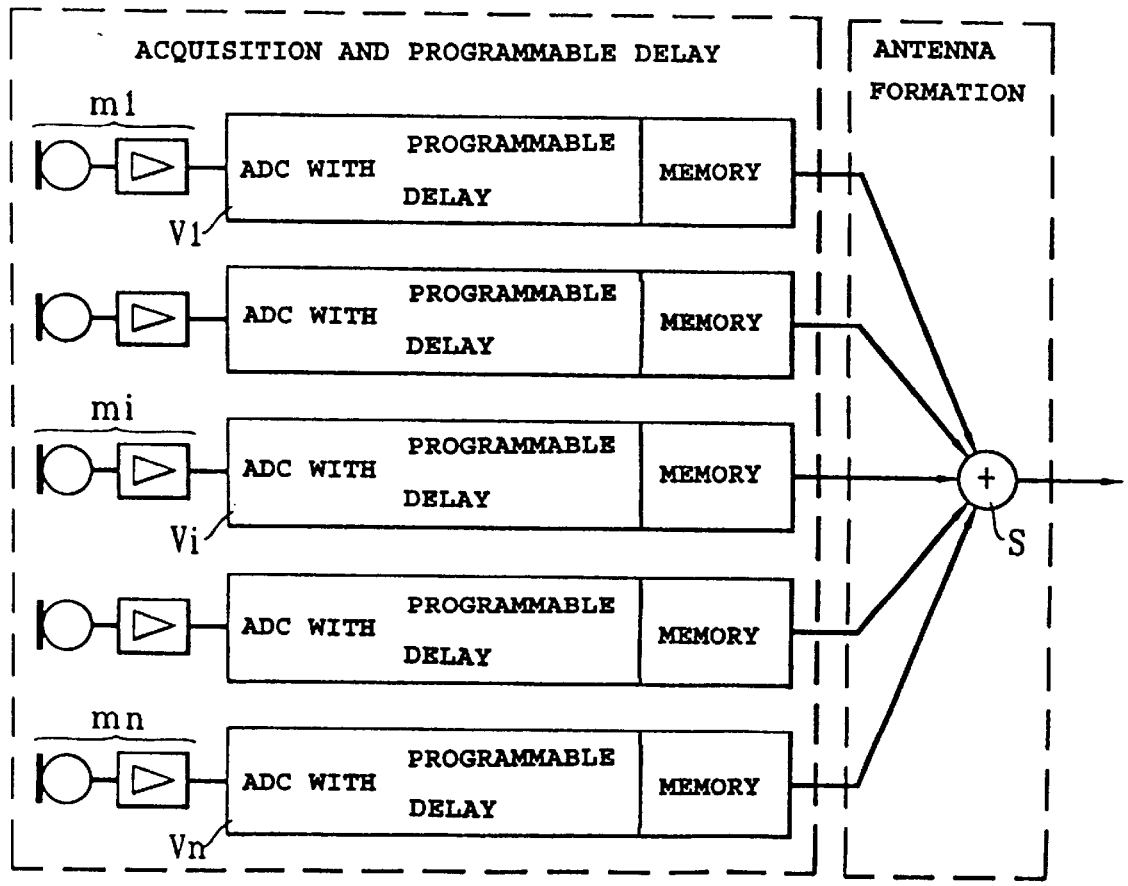
FIG. 4b represents the block diagram of an electronic scanning acoustic antenna produced by virtue of the implementation of a plurality of programmable delay devices in accordance with the subject of the present invention.
Figure 4A:
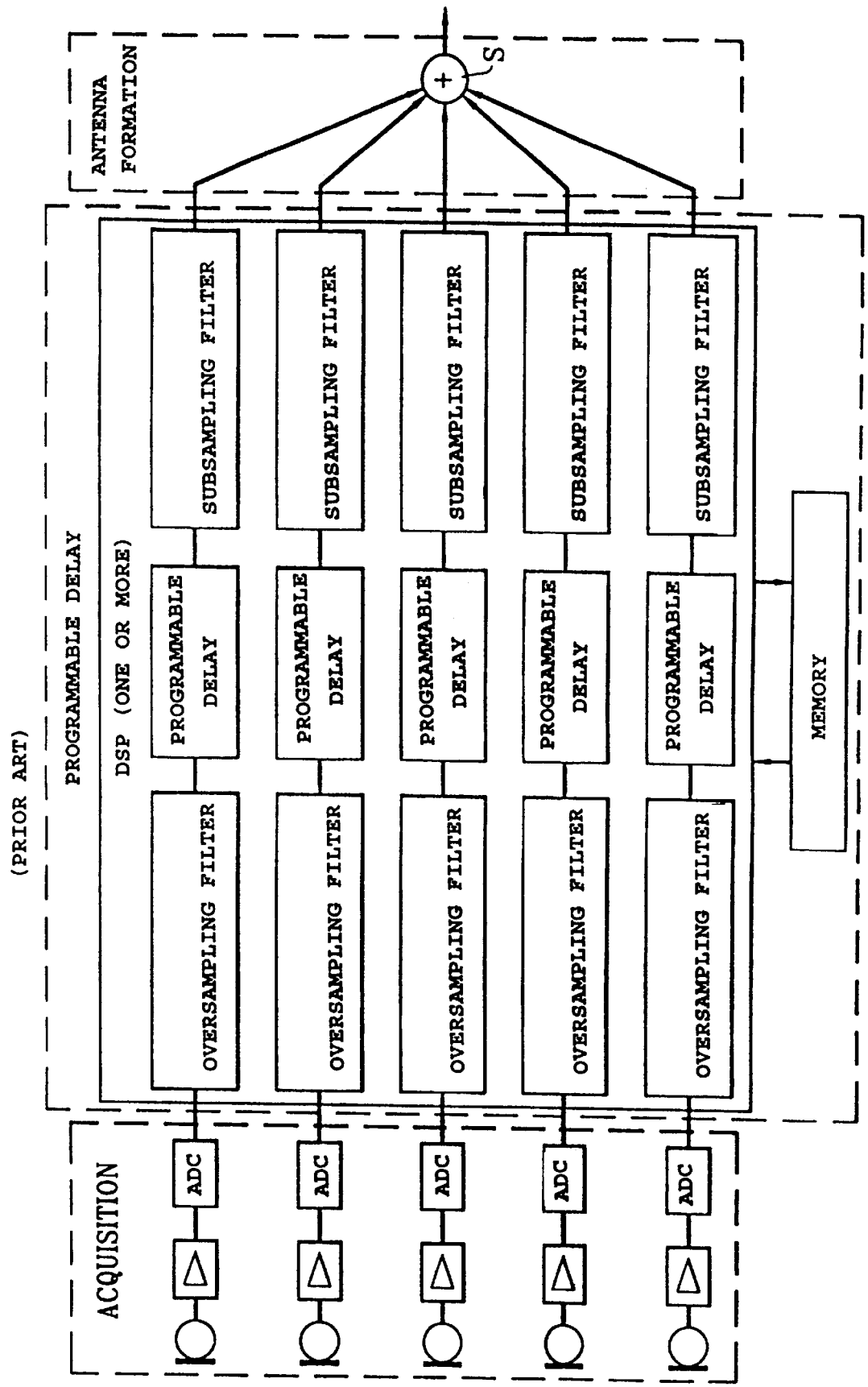
FIG. 4a represents the block diagram of an acoustic antenna of the prior art of the sum-antenna type with a variable steering angle, called an electronic scanning acoustic antenna.

Finally, in FIG. 4a, an acoustic antenna of the electronic scanning type has been represented, implemented by means of a digital signal processor, in accordance with the techniques of the prior art.

In this embodiment, this antenna comprises five microphones and corresponds to an antenna of the type with variable steering angle, that is to say an antenna of the electronic scanning type.

It is broken down into three distinct elements:
 a first part, acquisition of the microphone signals, each microphone being linked to an analog amplifier and to an analog/digital converter of conventional type, as described previously in the description, in the introduction,
 a second part, programmable delay,
 a third part, formation of the antenna.

For the programmable delay part, the conventional technique consists in using one or more digital signal digital processors, this conventional technique, however, introducing the degradations in the signal previously mentioned in the description.

In FIG. 4b, the same antenna has been represented, implemented, in contrast, by virtue of the use of delay devices in accordance with the subject of the present invention, the antenna including the microphones associated with their analog amplifier and denoted $m_i$, each programmable delay device, denoted $V_1$ to $V_N$, in accordance with the subject of the present invention, being connected directly at the output of each corresponding analog amplifier.

The embodiment as described in FIG. 4b makes it possible to perform the same pure delay function without introducing any degradation of the signal.

In a general way, the programmable delay devices in accordance with the subject of the present invention may be used in all types of programmable acoustic antenna, whether it is used as an antenna with variable steering angle or, in contrast, as an antenna for which a specific receiving pattern is sought.

More generally, the programmable delay device, the subject of the present invention, can be used in any application requiring the introduction of a delay with a precision less than the time separating two successive samples after sampling, by virtue of the use of a $\Delta\Sigma$-type analog/digital converter.

The use of programmable delay devices in accordance with the subject of the present invention makes it possible to overcome all the problems encountered when it is necessary to use the delay function implemented by means of signal processors and in accordance with the corresponding constraint due to the necessary limitation of the length of the filters used, which has the consequence of a degradation in the signals subjected to this type of processing, the necessity of processing even the signals not requiring a delay, and significant overall delay in the chain due to the presence of digital filters.

Moreover, it is shown that the use of programmable delay devices, according to the invention, is then achieved for a modest cost price, which is all the more so as the memory size necessary can be optimized as described previously in the description.

We claim:

1. A device for programmable delay of an analog signal, wherein said device comprises:
 an analog/digital converter circuit receiving said analog signal and producing a digital signal at a first sampling frequency, comprising a succession of samples;
 a delay memory receiving said digital signal in write mode and providing memory storage of M consecutive samples;

means for write and read access to said delay memory for addressing said delay memory, in a write and read mode, with a write and read frequency equal to the first sampling frequency, said delay memory producing, under read access control, a series of samples delayed by a defined delay which is a function of the number of samples M stored in said delay memory, with respect to the succession of samples received for writing at the input of said delay memory, said delayed samples forming a delayed digital signal, said write and read access means simultaneously delivering, to said delay memory, a write address pointer and at least one read address pointer, the difference in the addresses of said pointers being equal to the number M of samples stored in memory, and said defined delay introduced by said delay memory being equal to the product of the number M of samples stored in memory between the write address pointer and said at least one read address pointer and of a period $T_1$ which is the inverse of said first sampling frequency $F_1$; and sub-sampling means receiving said delayed digital signal and delivering a sub-sampled delayed digital signal at a second sampling frequency, lower than the first sampling frequency.

2. Device according to claim 1, wherein said write and read access means simultaneously deliver to said delay memory:

a write address pointer (pae);

a plurality of read address pointers ($pal_i$) with i $\epsilon[1,P]$, said delay memory making it possible to deliver, on P channels in parallel, P delayed digital signals, the delay of which is proportional to the level i and to the value of the address of the read pointer of corresponding level, said sub-sampling means being formed by P channels in parallel, each sub-sampling channel receiving a delayed digital signal of corresponding level.

3. Device according to claim 1, wherein said analog/digital converter circuit is a converter including a plurality of conversion stages in cascade each driven by a different sampling frequency.

4. Device according to claim 1, wherein said sub-sampling means is formed by a plurality of sub-sampling filters connected in cascade, each sub-sampling filter of level j receiving the sub-sampled delayed digital signal delivered by the sub-sampling filter of lower level j−1, at the frequency $F_{j-1}$, and delivering a sub-sampled delayed digital signal at a sampling frequency $F_j$, successively.

5. A programmable acoustic antenna comprising a plurality of channels in parallel, interconnected to a common summer circuit, each channel including, in cascade:

an acoustic transducer interconnected to an amplifier, and a programmable delay device interconnected between the amplifier and said common summer circuit, said programmable delay device comprising:

an analog/digital converter circuit receiving said analog signal and delivering a digital signal at a first sampling frequency, comprising a succession of samples;

a delay memory receiving said digital signal in write mode and allowing memory storage of M consecutive samples;

means for write and read access to said delay memory for addressing said delay memory, in write and read mode, with a write and read frequency equal to the first sampling frequency, said delay memory delivering, under read access control, a series of samples delayed by a defined value, which is a function of the number of samples M stored in said delay memory, with respect to the succession of samples received for writing at the input of said delay memory, said delayed samples forming a delayed digital signal; and sub-sampling means receiving said delayed digital signal and delivering a sub-sampled delayed digital signal at a second sampling frequency, lower than the first sampling frequency.

6. A device for providing programmable delay of an analog signal, said device comprising:

an analog/digital converter circuit receiving said analog signal and delivering a digital signal, at a first sampling frequency, comprising a succession of samples;

a delay memory for write and read access to said delay memory for addressing said delay memory, in a write and read mode, with a write and read frequency equal to the first sampling frequency, said delay memory delivering, under read access control, a series of samples delayed by a defined value, which is a function of the number of samples M stored in said delay memory, with respect to the succession of samples received for writing at the input of said delay memory, said delayed samples forming a delayed digital signal;

sub-sampling means receiving said delayed digital signal and delivering a sub-sampled delayed digital signal at a second sampling frequency, lower than the first sampling frequency, said sub-sampling means comprising a plurality of sub-sampling filters connected in cascade, each sub-sampling filter of level j receiving the sub-sampled delayed digital signal delivered by the sub-sampling filter of lower level j−1, at the frequency $F_{j-1}$, and delivering a sub-sampled delayed digital signal at a sampling frequency $F_j$, successively, and said delay memory comprising a plurality of elementary delay memories, an elementary memory of level j−1 receiving an input digital signal at the frequency $F_{j-1}$ and delivering a delayed digital signal at the frequency $F_{j-1}$ to the corresponding level-j sub-sampling filter, to which said elementary delay memory is connected, the memory size of each elementary delay memory of level j−1 being proportional to the ratio of the frequency $F_{j-1}$ of the digital signal delivered by said elementary delay memory and the frequency $F_j$ of the delayed digital signal delivered by the level-j sub-sampling filter which is connected to said elementary delay memory.

* * * * *